(12) United States Patent
Kang et al.

(10) Patent No.: US 11,189,635 B2
(45) Date of Patent: Nov. 30, 2021

(54) 3D-NAND MOLD

(71) Applicant: Applied Materials, Inc., Santa Clara, CA (US)

(72) Inventors: Chang Seok Kang, San Jose, CA (US); Tomohiko Kitajima, San Jose, CA (US); Mukund Srinivasan, Fremont, CA (US); Sanjay Natarajan, Portland, OR (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 137 days.

(21) Appl. No.: 16/833,899

(22) Filed: Mar. 30, 2020

(65) Prior Publication Data

US 2020/0312874 A1    Oct. 1, 2020

Related U.S. Application Data

(60) Provisional application No. 62/827,360, filed on Apr. 1, 2019.

(51) Int. Cl.
*H01L 27/11582*    (2017.01)
*H01L 29/792*    (2006.01)
(Continued)

(52) U.S. Cl.
CPC .. *H01L 27/11582* (2013.01); *H01L 21/02164* (2013.01); *H01L 21/31116* (2013.01);
(Continued)

(58) Field of Classification Search
CPC ......... H01L 27/11582; H01L 21/31116; H01L 21/32051; H01L 21/67703;
(Continued)

(56) References Cited

U.S. PATENT DOCUMENTS 8,188,445 B2    3/2012    Godet et al.
8,536,029 B1    9/2013    Chang et al.
(Continued)

FOREIGN PATENT DOCUMENTS

WO    2018/195423    10/2018

OTHER PUBLICATIONS

PCT International Search Report and Written Opinion in PCT/US2020/026067 dated Jul. 15, 2020, 12 pages.
(Continued)

*Primary Examiner* — David Vu
(74) *Attorney, Agent, or Firm* — Servilla Whitney LLC

(57) ABSTRACT

Methods of manufacturing memory devices are provided. The methods decrease the thickness of the first layers and increase the thickness of the second layers. Semiconductor devices are described having a film stack comprising alternating nitride and second layers in a first portion of the device, the alternating nitride and second layers of the film stack having a nitride:oxide thickness ratio ($N_f{:}O_f$); and a memory stack comprising alternating word line and second layers in a second portion of the device, the alternating word line and second layers of the memory stack having a word line:oxide thickness ratio ($W_m{:}O_m$), wherein $0.1(W_m{:}O_m) < N_f{:}O_f < 0.95(W_m{:}O_m)$.

20 Claims, 14 Drawing Sheets

(51) Int. Cl.

| | | |
|---|---|---|
| *H01L 27/11575* | (2017.01) | |
| *H01L 21/3205* | (2006.01) | |
| *H01L 21/311* | (2006.01) | |
| *H01L 21/677* | (2006.01) | |
| *H01L 21/02* | (2006.01) | |
| *H01L 21/3213* | (2006.01) | |

(52) U.S. Cl.
CPC .. *H01L 21/32051* (2013.01); *H01L 21/32055* (2013.01); *H01L 21/32135* (2013.01); *H01L 21/67703* (2013.01)

(58) Field of Classification Search
CPC ......... H01L 21/02164; H01L 21/32135; H01L 21/32055; H01L 27/11575; H01L 29/7926; H01L 21/67184
See application file for complete search history.

(56) References Cited

U.S. PATENT DOCUMENTS

| | | |
|---|---|---|
| 8,623,171 B2 | 1/2014 | Godet et al. |
| 9,190,498 B2 | 11/2015 | Brand et al. |
| 9,385,195 B1 | 7/2016 | Zhang |
| 9,502,518 B2 | 11/2016 | Liu et al. |
| 9,953,983 B2 | 4/2018 | Zhang |
| 9,960,045 B1 | 5/2018 | Purayath |
| 10,043,819 B1 | 8/2018 | Lai et al. |
| 10,319,739 B2 | 6/2019 | Purayath |
| 10,325,923 B2 | 6/2019 | Purayath |
| 10,354,916 B2 | 6/2019 | Chen et al. |
| 10,410,869 B2 | 9/2019 | Roy et al. |
| 10,468,259 B2 | 11/2019 | Purayath et al. |
| 10,529,737 B2 | 1/2020 | Purayath |
| 10,541,246 B2 | 1/2020 | Purayath |
| 10,553,604 B2 | 2/2020 | Lu et al. |
| 10,622,251 B2 | 4/2020 | Chen et al. |
| 10,790,298 B2 | 9/2020 | Purayath |
| 10,886,172 B2 | 1/2021 | Chen |
| 10,964,717 B2 | 3/2021 | Kang et al. |
| 10,998,329 B2 | 5/2021 | Koshizawa et al. |
| 11,024,371 B2 | 6/2021 | Cui et al. |
| 11,049,695 B2 | 6/2021 | Kang et al. |
| 2007/0042548 A1 | 2/2007 | Noh et al. |
| 2011/0291190 A1 | 12/2011 | Xiao et al. |
| 2012/0258600 A1 | 10/2012 | Godet et al. |
| 2013/0306935 A1 | 11/2013 | Chang et al. |
| 2014/0034611 A1 | 2/2014 | Godet et al. |
| 2014/0175530 A1 | 6/2014 | Chien et al. |
| 2014/0262036 A1 | 9/2014 | Reuter et al. |
| 2015/0041879 A1* | 2/2015 | Jayanti .............. H01L 29/66825 257/324 |
| 2015/0123189 A1 | 5/2015 | Sun et al. |
| 2015/0325411 A1 | 9/2015 | Godet |
| 2016/0111513 A1 | 4/2016 | Liu et al. |
| 2016/0118403 A1 | 4/2016 | Yoo |
| 2016/0190312 A1 | 6/2016 | Zhang et al. |
| 2016/0307912 A1 | 10/2016 | Izumi et al. |
| 2016/0322381 A1 | 11/2016 | Liu et al. |
| 2017/0062455 A1 | 3/2017 | Nomura |
| 2017/0069637 A1 | 3/2017 | Son et al. |
| 2017/0278864 A1 | 9/2017 | Hu et al. |
| 2018/0090307 A1 | 3/2018 | Brunner et al. |
| 2018/0144977 A1 | 5/2018 | Yu et al. |
| 2018/0330985 A1 | 11/2018 | Yu et al. |
| 2019/0393042 A1 | 12/2019 | Roy et al. |
| 2020/0051994 A1 | 2/2020 | Purayath et al. |
| 2020/0118822 A1 | 4/2020 | Falk et al. |
| 2020/0185408 A1 | 6/2020 | Song et al. |
| 2020/0203373 A1 | 6/2020 | Kang et al. |
| 2020/0266211 A1 | 8/2020 | Tao et al. |
| 2020/0312874 A1 | 10/2020 | Kang et al. |
| 2020/0350014 A1 | 11/2020 | Liu |
| 2020/0350287 A1 | 11/2020 | Liu |
| 2020/0402562 A1 | 12/2020 | Li et al. |
| 2020/0411509 A1 | 12/2020 | Yang et al. |
| 2021/0043643 A1 | 2/2021 | Lu et al. |
| 2021/0126005 A1 | 4/2021 | Lu et al. |
| 2021/0210142 A1 | 7/2021 | Liu |
| 2021/0217773 A1 | 7/2021 | Kang et al. |
| 2021/0225865 A1 | 7/2021 | Wu |
| 2021/0233779 A1 | 7/2021 | Kang et al. |
| 2021/0233918 A1 | 7/2021 | Koshizawa et al. |
| 2021/0249436 A1 | 8/2021 | Ding et al. |
| 2021/0257385 A1 | 8/2021 | Hu et al. |
| 2021/0257386 A1 | 8/2021 | Wang et al. |
| 2021/0257387 A1 | 8/2021 | Huang et al. |
| 2021/1025737 | 8/2021 | Koshizawa et al. |

OTHER PUBLICATIONS

Kataria, Himanshu, et al., "Speeding Up Silicon With Infrared Lasers", Silicon Semiconductor Magazine, Oct. 3, 2014, 22 pages.
Kongetira, Poonacha P., et al., "Modeling of Growth Rates of Selective Epitaxial Growth (SEG) and Epitaxial Lateral Overgrowth (ELO) of Silicon in the SIH2CL2—HCLH2 System", Purdue University e-Pubs, Oct. 1, 1994, pp. 1-67.

\* cited by examiner

3D-NAND MOLD

CROSS-REFERENCE TO RELATED APPLICATIONS

This application claims priority to U.S. Provisional Application No. 62/827,360, filed Apr. 1, 2019, the entire disclosure of which is hereby incorporated by reference herein.

TECHNICAL FIELD

Embodiments of the present disclosure pertain to the field of electronic devices and methods and apparatus for manufacturing electronic devices. More particularly, embodiments of the disclosure provide methods for forming 3D-NAND mold stacks.

BACKGROUND

Semiconductor technology has advanced at a rapid pace and device dimensions have shrunk with advancing technology to provide faster processing and storage per unit space. In NAND devices, the string current needs to be high enough to obtain sufficient current to differentiate ON and OFF cells. The string current is dependent on the carrier mobility which is enhanced by enlarging the grain size of the silicon channel.

Existing 3D-NAND memory stacks with alternating layers of oxide and nitride require replacement metal gate (RMG) process to build word lines. The silicon nitride layer is mechanically unstable due to large amounts of residual hydrogen remaining. The hydrogen adversely affects deformation of patterns and/or process controllability or memory hole etching processes.

Accordingly, there is a need in the art for 3D-NAND devices having lower levels of residual hydrogen. Additionally, there is a need in the art for methods and apparatus for forming the 3D-NAND devices.

SUMMARY

One or more embodiments of the disclosure are directed to method of forming memory devices. In one embodiment, a method of forming an electronic device comprises removing one or more first layers from a film stack comprising alternating second layers and first layers, the first layers removed from a first side of the first layers to leave an opening bounded on a second side by one or more films comprising a poly-silicon layer, the opening having a first thickness; trimming the adjacent second layers through the opening to increase the thickness of the opening from the first thickness to a second thickness and decrease a first oxide layer thickness to a second oxide layer thickness smaller than the first oxide layer thickness; and depositing a word line replacement material in the opening.

Additional embodiments of the disclosure are directed to semiconductor memory devices. In one an embodiment, a semiconductor memory device comprises: a film stack comprising alternating nitride and oxide layers in a first portion of the device, the alternating nitride and oxide layers of the film stack having a nitride:oxide thickness ratio ($N_f:O_f$); and a memory stack comprising alternating word line and oxide layers in a second portion of the device, the alternating word line and oxide layers of the memory stack having a word line:oxide thickness ratio ($W_m:O_m$), wherein $0.1(W_m:O_m) < N_f:O_f < 0.95(W_m:O_m)$.

Further embodiments of the disclosure are directed to processing tools. In one embodiment, a processing tool comprises: a central transfer station comprising a robot configured to move a wafer; plurality of process stations, each process station connected to the central transfer station and providing a processing region separated from processing regions of adjacent process stations, the plurality of process stations comprising an oxide layer thinning chamber and a word line deposition chamber; and a controller connected to the central transfer station and the plurality of process stations, the controller configured to activate the robot to move the wafer between process stations, and to control a process occurring in each of the process stations.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

Existing 3D-NAND memory stacks with alternating layers of oxide and nitride require replacement metal gate (RMG) process to build word lines. The silicon nitride layer is mechanically unstable due to large amounts of residual hydrogen remaining. The hydrogen adversely affects deformation of patterns and/or process controllability or memory hole etching processes. Accordingly, embodiments of the disclosure provide methods that decrease the thickness of the nitride layer and increase the thickness of the oxide layer. Thus, the oxide/nitride mold of one or more embodiments makes it possible to achieve desired thickness of oxide/nitride mold with a reduced SiN thickness and an increased oxide thickness. In one or more embodiments, the alternating layers are not limited to alternating layers if nitride and oxide but may comprise alternating layers of a first material and a second material.

To control the surface between poly-silicon and the metal, metal deposition and other processes can be carried out in an isolated environment (e.g., a cluster process tool). Accordingly, some embodiments of the disclosure provide integrated tool systems with related process modules to implement the methods.

Figure 1:
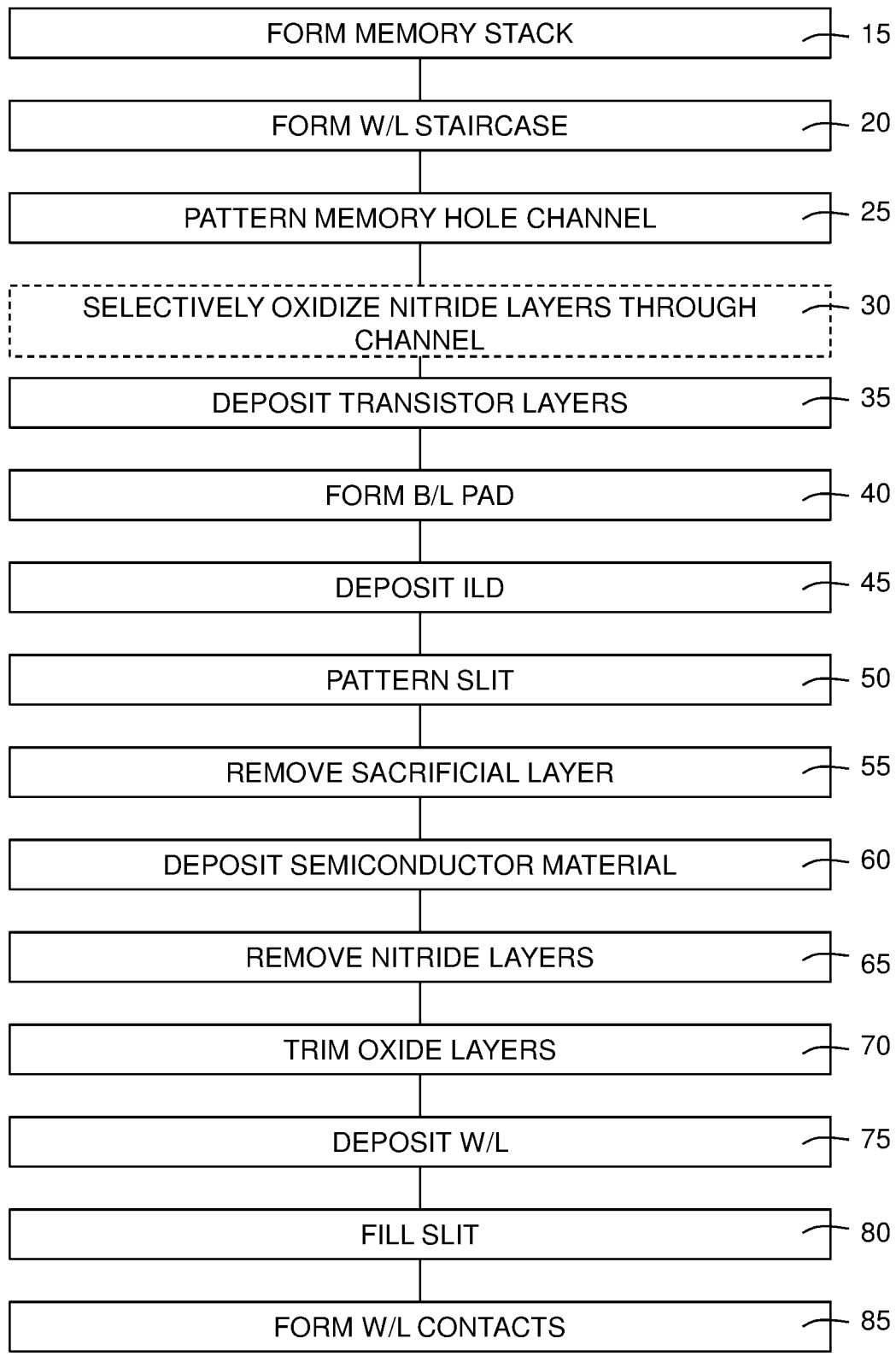
FIG. 1 depicts a flow process diagram of one embodiment of a method of forming a memory device according to embodiments described herein.

FIG. 1 illustrates a flowchart for an exemplary method 10 for forming a memory device. The skilled artisan will recognize that the method 10 can include any or all of the processes illustrated. Additionally, the order of the individual processes can be varied for some portions. The method 10 can start at any of the enumerated processes without deviating from the disclosure. With reference to FIG. 1, at operation 15, a memory stack is formed. At operation 20, a word line staircase is formed in the memory stack. At operation 25, a memory hole channel is patterned into the word line staircase. At operation 30, optionally, the first layers, e.g. nitride layers, may be selectively oxidized through the memory hole channel. At operation 35, the transistor layers are deposited. At operation 40, the bit line pad is formed. At operation 45, an interlayer dielectric is deposited. At operation 50, the memory staircase is slit patterned. At operation 55, the sacrificial layer is removed. At operation 60, a semiconductor material is deposited. At operation 65, the first layers, e.g. nitride layers, are removed. At operation 70, the second layers, e.g. oxide layers, are trimmed. At operation 75, the word line replacement material is deposited. At operation 80, the slit is filled, and, at operation 85, the word line contacts are formed.

FIGS. 2-18 illustrate a portion of a memory device 100 following the process flow illustrated for the method 10 in FIG. 1.

Figure 2:
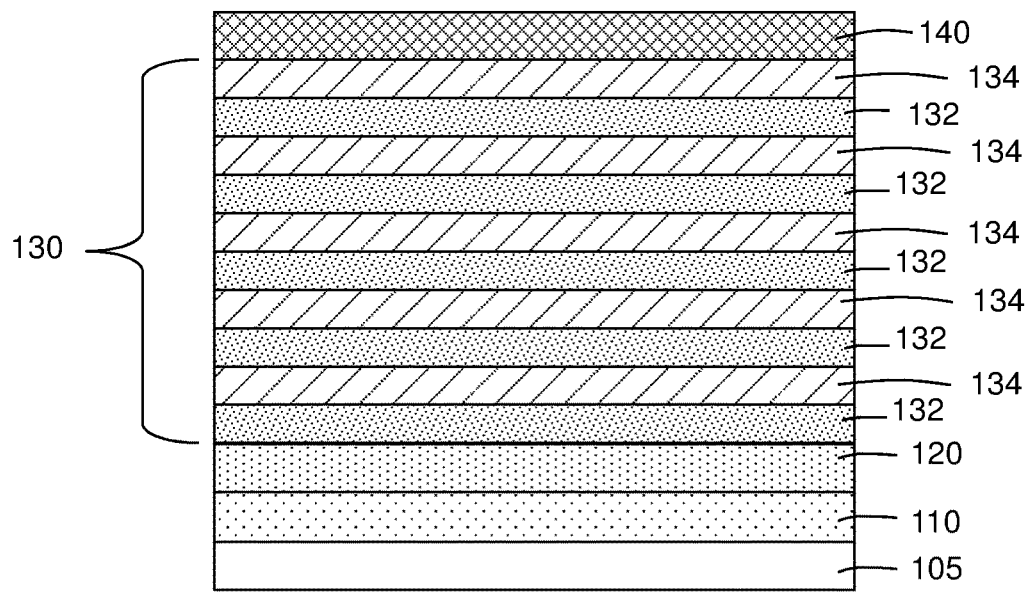
FIG. 2 illustrates a cross-sectional view of a device with a memory stack according to one or more embodiments.

FIG. 2 illustrates an initial or starting memory stack of an electronic device 100 in accordance with one or more embodiments of the disclosure. In some embodiments, the electronic device 100 shown in FIG. 2 is formed on the bare substrate 105 in layers, as illustrated. The electronic device of FIG. 2 is made up of a substrate 105, a semiconductor layer 110, a sacrificial layer 120, a memory stack 130 and an oxide layer 140.

The substrate 105 can be any suitable material known to the skilled artisan. As used in this specification and the appended claims, the term "substrate" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

A semiconductor layer 110 is on the substrate 105. The semiconductor layer 110 may also be referred to as the common source line. The semiconductor layer 110 can be formed by any suitable technique known to the skilled artisan and can be made from any suitable material including, but not limited to, poly-silicon (poly-Si). In some embodiments, the semiconductor layer 110 is a common source line that is made of a conductive or a semiconductor material.

The sacrificial layer 120 is formed on the semiconductor layer 110 and can be made of any suitable material. The sacrificial layer 120 in some embodiments is removed and replaced in later processes. In some embodiments, the sacrificial layer 120 is not removed and remains within the memory device 100. In this case, the term "sacrificial" has an expanded meaning to include permanent layers and may be referred to as the conductive layer. In the illustrated embodiment, as described further below, the sacrificial layer 120 is removed in operation 55. In one or more embodiments, the sacrificial layer 120 comprises a material that can be removed selectively versus the neighboring semiconductor layer 110 and oxide layer 132.

A memory stack 130 is formed on the sacrificial layer 120. The memory stack 130 in the illustrated embodiment comprises a plurality of alternating second layers 132 and first layers 134. In one or more embodiments, the first layers 134 comprise nitride layers and the second layers 132 comprise oxide layers. In some embodiments, the memory stack 130 comprises a non-replacement gate such as alternating oxide and poly-Si(OP), or oxide and metal, or oxide and sacrificial layer. The first layers 134 comprise a material that is etch selective relative to the second layers 132 so that the first layers 134 can be removed without substantially affecting the second layers 132. In one or more embodiments, the first layers 134 comprise silicon nitride. In one or more embodiments, the second layers 132 comprise silicon oxide.

The individual alternating layers may be formed to any suitable thickness. In some embodiments, the thickness of each second layer 132 is approximately equal. In one or more embodiments, each second layer 132 has a first second layer thickness. In some embodiments, the thickness of each first layer 134 is approximately equal. As used in this regard, thicknesses which are approximately equal are within +/−5% of each other. In some embodiments, a silicon layer (not shown) is formed between the second layers 132 and first layers 134. The thickness of the silicon layer may be relatively thin as compared to the thickness of a layer of second layers 132 or first layers 134. In one or more embodiments, the first layers 134 have a thickness in a range of from about 0.5 nm to about 30 nm, including about 1 nm, about 3 nm, about 5 nm, about 7 nm, about 10 nm, about 12 nm, about 15 nm, about 17 nm, about 20 nm, about 22 nm, about 25 nm, about 27 nm, and about 30 nm. In one or more embodiments the nitride layer 134 has a thickness in the range of from about 0.5 to about 40 nm.

Figure 3:
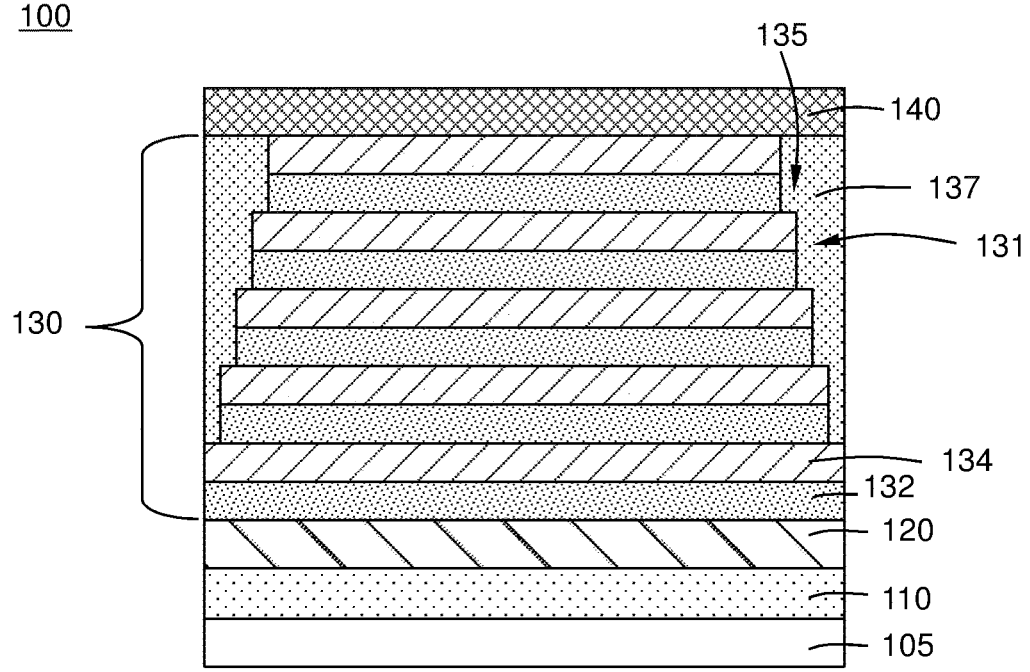
FIG. 3 illustrates a cross-sectional view of a substrate after forming a staircase pattern of the memory stack according to one or more embodiments.

Referring to FIG. 3, at operation 20 of method 10, a staircase formation 131 is created. The staircase formation 131 exposes a top surface 135 of the second layers 132. The top surface 135 can be used to provide space for word line contacts to be formed, as described below. A suitable fill material 137 can be deposited to occupy the space outside the staircase formation 131. A suitable fill material 137, as will be understood by the skilled artisan, can be any material that prevents electrical shorting between adjacent word lines. A staircase formation 131 with each word line having a smaller width (illustrated from left-to-right in the figures) than the word line below. Use of relative terms like "above" and "below" should not be taken as limiting the scope of the disclosure to a physical orientation in space.

Figure 4A:
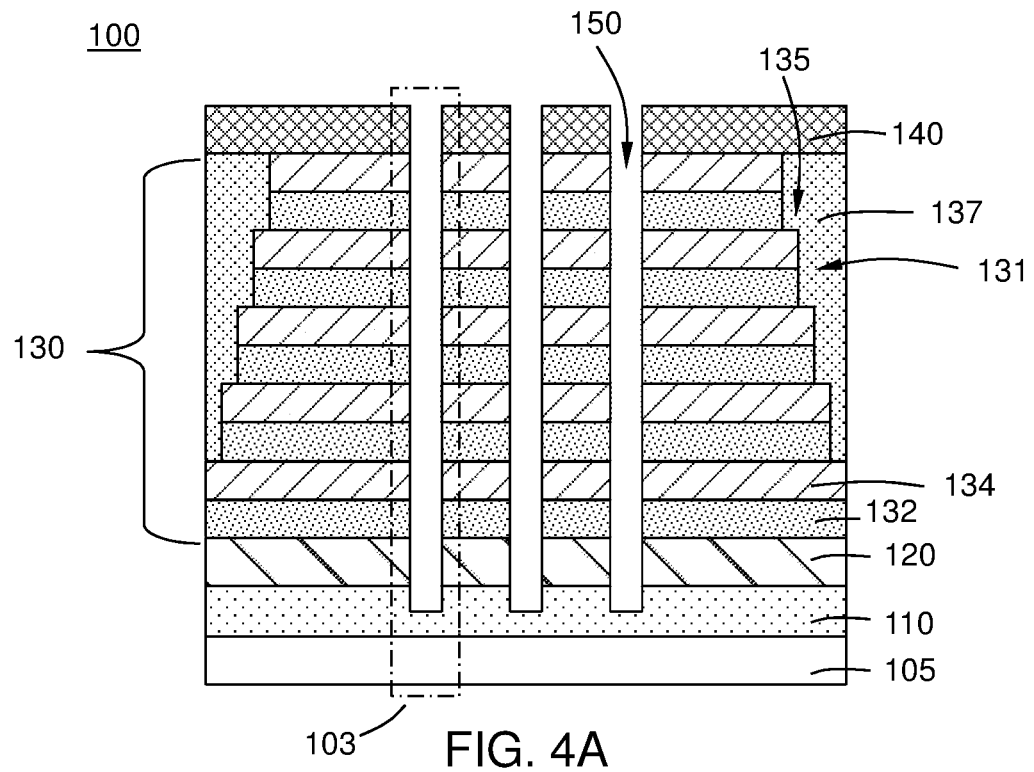
FIG. 4A illustrates a cross-sectional view of a substrate after formation of a memory hole according to one or more embodiments.
Figure 4B:
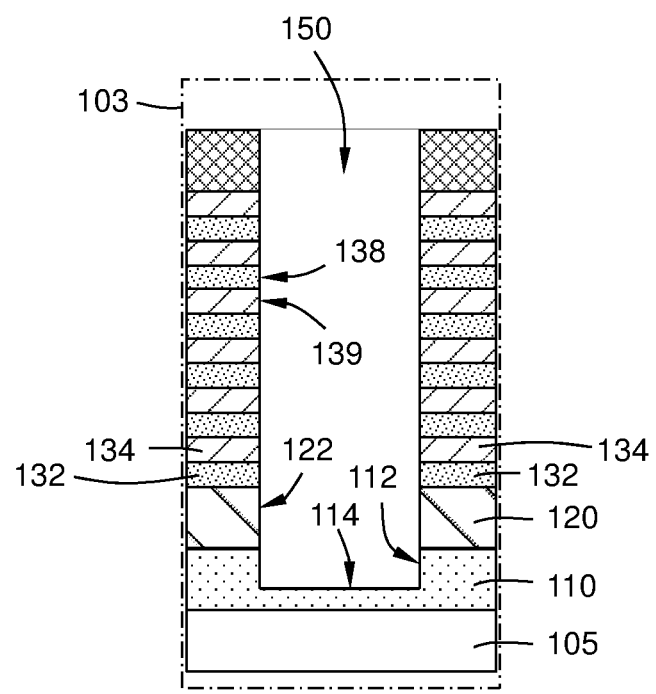
FIG. 4B illustrates a cross-sectional view region 103 of the substrate of FIG. 4A according to one of more embodiments.

Referring to FIGS. 4A and 4B, at operation 25 a memory hole channel 150 is opened through the memory stack 130. In some embodiments, opening the memory hole channel 150 comprises etching through the oxide layer 140, memory stack 130, sacrificial layer 120, and into semiconductor layer 110. Referring to FIG. 4B, which is an expanded view of region 103, the memory hole channel 150 has sidewalls that extend through the memory stack 130 exposing surfaces 138 of the second layers 132 and surface 139 of the first layers 134.

The sacrificial layer 120 has surfaces 122 exposed as sidewalls of the memory hole channel 150. The memory channel hole 150 extends a distance into the semiconductor layer 110 so that sidewall surface 112 and bottom 114 of the memory hole channel 150 are formed within the semiconductor layer 110. The bottom 114 of the memory hole channel 150 can be formed at any point within the thickness of the semiconductor layer 110. In some embodiments, the memory hole channel 150 extends a thickness into the semiconductor layer 110 in the range of from about 10% to about 90%, or in the range of from about 20% to about 80%, or in the range of from about 30% to about 70%, or in the range of from about 40% to about 60% of the thickness of the semiconductor layer 110. In some embodiments, the memory hole channel 150 extends a distance into the semiconductor layer 110 by greater than or equal to 10%, 20%, 30%, 40%, 50%, 60%, 70% or 80% of the thickness of the semiconductor layer 110.

Figure 5A:
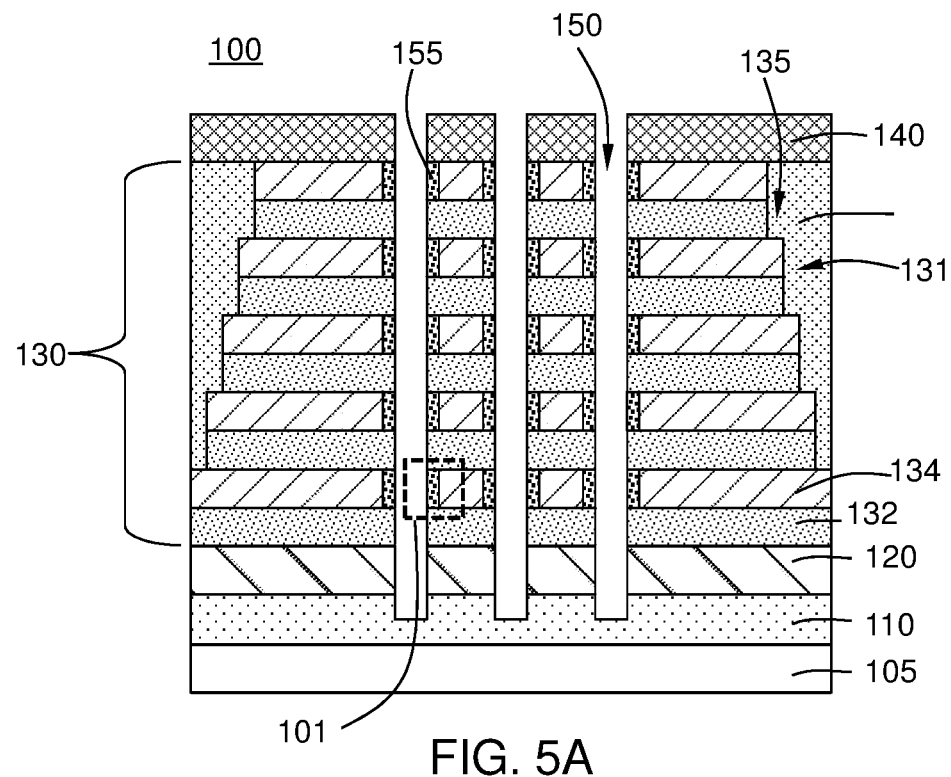
FIG. 5A illustrates a cross-sectional view of a substrate after selective oxidation of a nitride layer according to one or more embodiments.
Figure 5B:
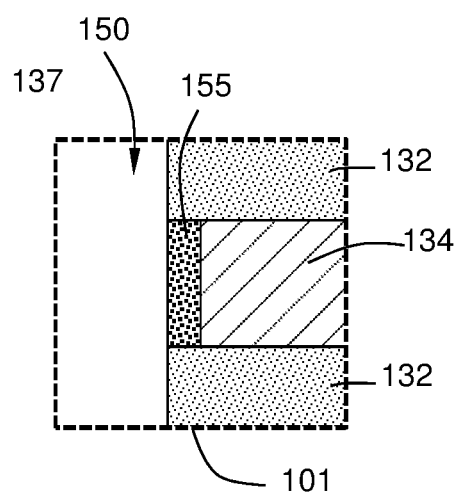
FIG. 5B illustrates an expanded view of region 101 according to one or more embodiments.

FIG. 5A shows operation 30 in which the first layers 134, e.g. nitride layers, are selectively oxidized through the memory hole channel 150. In one or more embodiments, the selective oxidation of the first layers 134, e.g. nitride layers, is optional. FIG. 5B is an expanded view of region 101 of FIG. 5A. In one or more embodiments, the first layers 134, e.g. nitride layers, are selectively oxidized by in situ steam generation (ISSG) oxidation or radical plasma oxidation (RPO) at a temperature in a range of from about 700° C. to about 900° C. in an atmosphere of hydrogen ($H_2$) gas and oxygen ($O_2$) gas at ambient pressure. The ISSG oxide 155 is formed adjacent the memory hole channel 150 in the first layers 134, e.g. nitride layers. Without intending to be bound by theory, it is thought that the ISSG oxide 155 protects the blocking oxide 176 from etching during the nitride pull-back by hot phosphorus. In one or more embodiments, the ISSG oxide layer 155 or RPO oxide layer 155 has a thickness of about 2 nm.

Figure 6A:
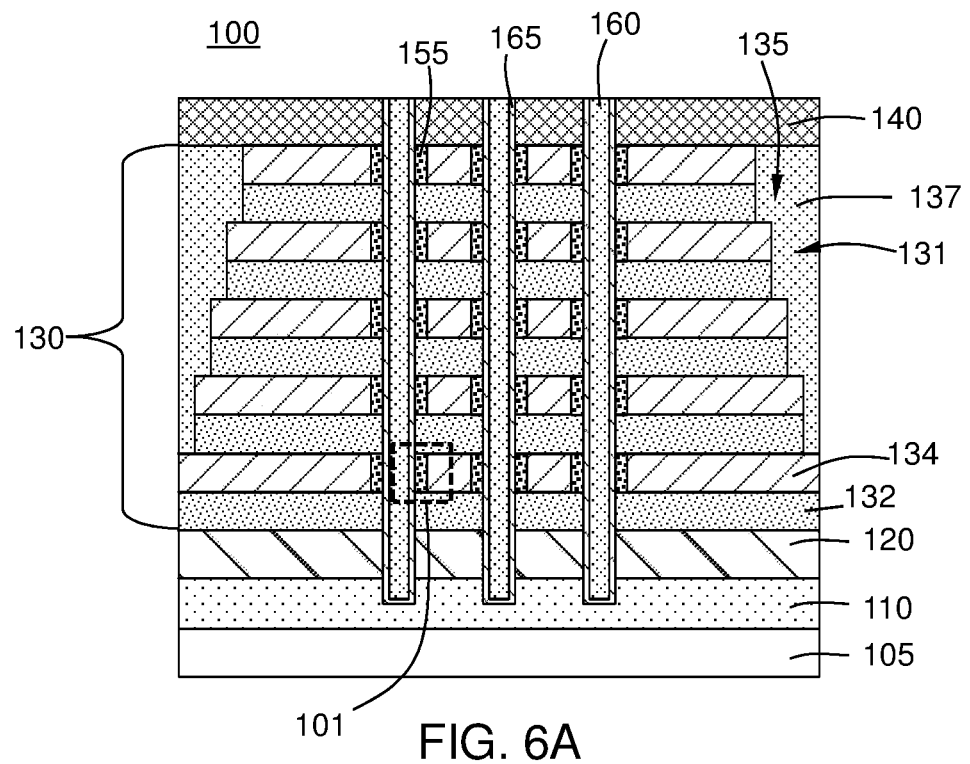
FIG. 6A illustrates a cross-sectional view of a substrate according to one or more embodiments.
Figure 6B:
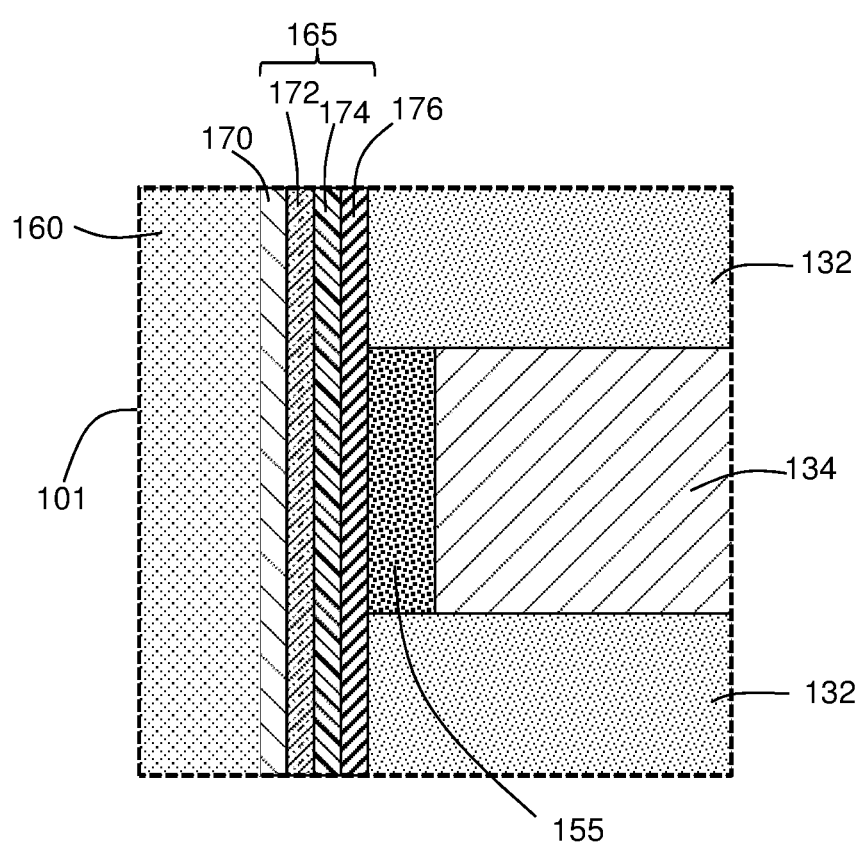
FIG. 6B illustrates an expanded view of region 101 after according to one or more embodiments.

FIGS. 6A and 6B show operation 35 in which transistor layers 165 are conformally deposited into memory hole channel 150 adjacent the second layers 132 and the ISSG oxide layer 155 or RPO oxide layer 155. The transistor layers 165 can be formed by any suitable technique known to the skilled artisan. In some embodiments, the transistor layers 165 are formed by a conformal deposition process. In some embodiments, the transistor layers 165 are formed by one or more of atomic layer deposition or chemical vapor deposition.

In one or more embodiments, the deposition of the transistor layers 165 is substantially conformal. As used herein, a layer which is "substantially conformal" refers to a layer where the thickness is about the same throughout (e.g., on the top, middle and bottom of sidewalls and on the bottom of the memory hole channel 150). A layer which is substantially conformal varies in thickness by less than or equal to about 5%, 2%, 1% or 0.5%.

Referring to FIG. 6B, which is an expanded view of region 101, in one or more embodiments, the transistor layers 165 comprises a blocking oxide layer 176 (or a first oxide layer 176), a nitride trap layer 174 on the first oxide layer 176, a second oxide layer 172 (or the tunneling oxide layer 172) on the nitride trap layer 174 and a poly-silicon layer 170 in the memory hole channel 150 on the second oxide layer 172. In one or more embodiments, the blocking oxide layer 176, the charge trap nitride (SiN) layer 174, and the tunneling oxide layer 172 are deposited in the memory hole channel 150 on the sidewalls of the memory hole channel 150 or on the semiconductor layer 110.

In one or more embodiments a poly-silicon (poly-Si) layer 170 is formed in the memory hole channel 150 adjacent to the transistor layers 165. The poly-Si layer 170 can be formed directly on the transistor layers 165. The poly-Si layer 170 can be deposited by any suitable technique known to the skilled artisan, including, but not limited to, atomic layer deposition and chemical vapor deposition. In some embodiments, the poly-Si layer 170 is deposited as a conformal layer so that the poly-silicon layer is formed on sidewalls and exposed surface 138, 139, 122, 112 and bottom 114 (see FIG. 4B) of the memory hole channel 150.

The poly-silicon layer 170 can have any suitable thickness depending on, for example, the dimensions of the memory hole channel 150. In some embodiments, the poly-silicon layer 170 has a thickness in the range of from about 0.5 nm to about 50 nm, or in the range of from about 0.75 nm to about 35 nm, or in the range of from about 1 nm to about 20 nm. In some embodiments, the poly-silicon layer 170 is a continuous film. In one or more embodiments, the poly-silicon layer 170 is formed in a macaroni type with conformal deposition on the tunnel oxide layer 172, the poly-silicon layer 170 having a thickness in a range of from about 1 nm to about 20 nm. Then, the memory hole channel 150 is filled with a dielectric material 160.

Figure 7:
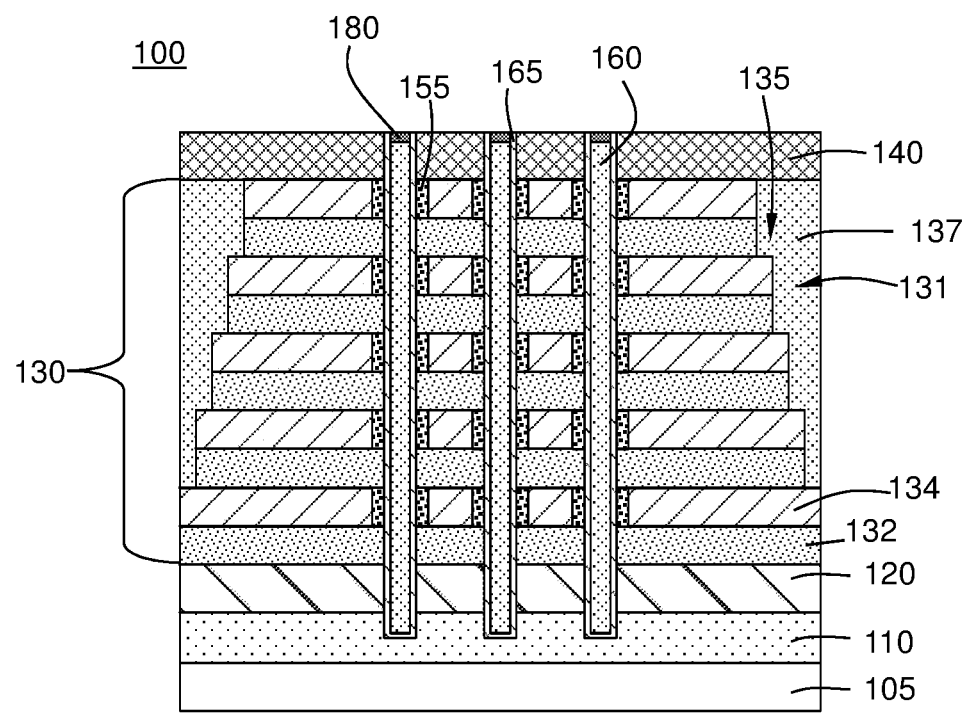
FIG. 7 illustrates a cross-sectional view of a substrate after formation of a bit line pad according to one or more embodiments.

FIG. 7 shows operation 40 of method 10 where a bit line pad 180 is formed in the poly-silicon (poly-Si) layer 160. The bit line pad 180 can be any suitable material known to the skilled artisan including, but not limited to, poly-silicon.

Figure 8:
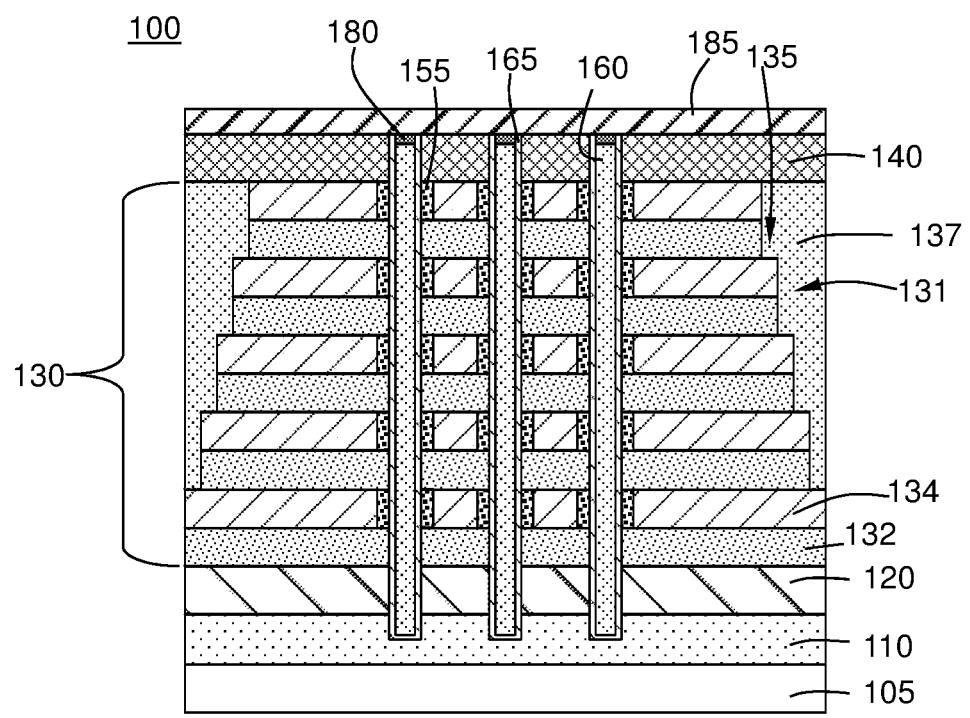
FIG. 8 illustrates a cross-sectional view of a substrate after deposition of an interlayer dielectric according to one or more embodiments.

FIG. 8 shows operation 45 of method 10 where an interlayer dielectric 185 is deposited on a top surface of the oxide layer 140 and the bit line pad 180. The interlayer dielectric (ILD) 185 may be deposited by any suitable technique known to one of skill in the art. The interlayer dielectric 185 may comprise any suitable material known to one of skill in the art. In one or more embodiments, the interlayer dielectric 185 is a low-K dielectric that includes, but is not limited to, materials such as, e.g., silicon dioxide, silicon oxide, carbon doped oxide ("CDO"), e.g., carbon doped silicon dioxide, porous silicon dioxide ($SiO_2$), silicon nitride (SiN), or any combination thereof. While the term "silicon oxide" may be used to describe the interlayer dielectric 185, the skilled artisan will recognize that the disclosure is not restricted to a particular stoichiometry. For example, the terms "silicon oxide" and "silicon dioxide" may both be used to describe a material having silicon and oxygen atoms in any suitable stoichiometric ratio. The same is true for the other materials listed in this disclosure, e.g. silicon nitride, silicon oxynitride, aluminum oxide, zirconium oxide, and the like.

Figure 9:
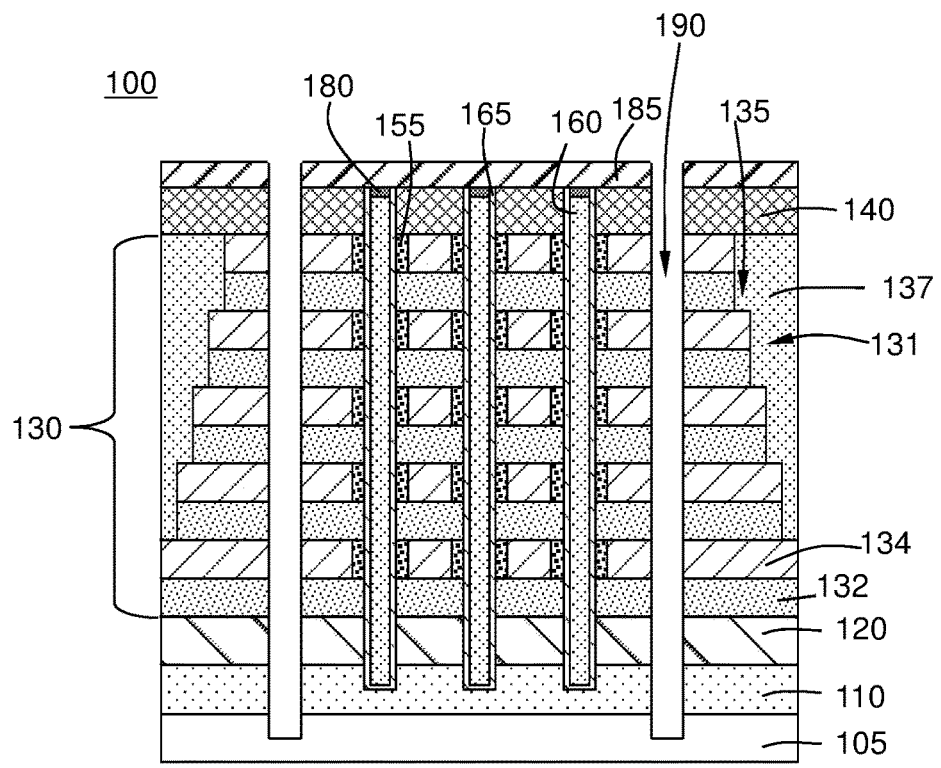
FIG. 9 illustrates a cross-sectional view of a substrate after slit patterning according to one or more embodiments.

FIG. 9 shows operation 50 of method 10 where the memory stack 130 is slit patterned to form slit pattern openings 190 that extend from a top surface of the interlayer dielectric 185 to the substrate 105.

Figure 10:
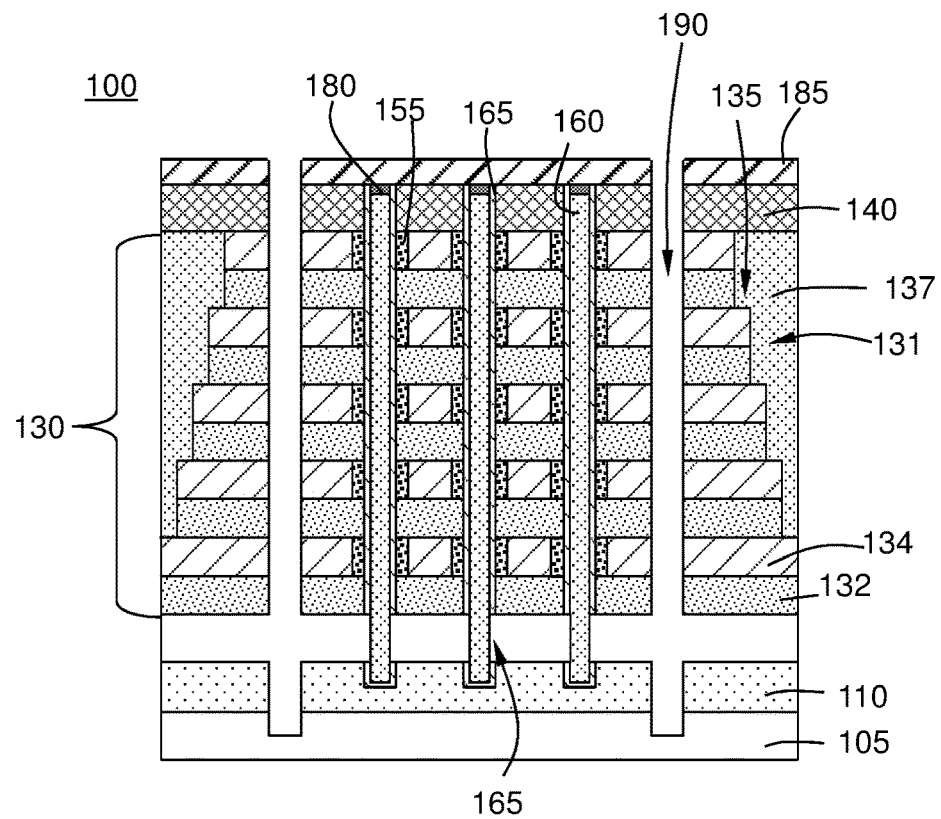
FIG. 10 illustrates a cross-sectional view of a substrate after a sacrificial layer is removed according to one or more embodiments.

FIG. 10 shows operation 55 of method 10 where the sacrificial layer 120 and a portion 165 of the poly-silicon layer 160 are removed. The sacrificial layer 120 can be removed by any suitable technique known to the skilled artisan including, but not limited to, selective etching.

Figure 11:
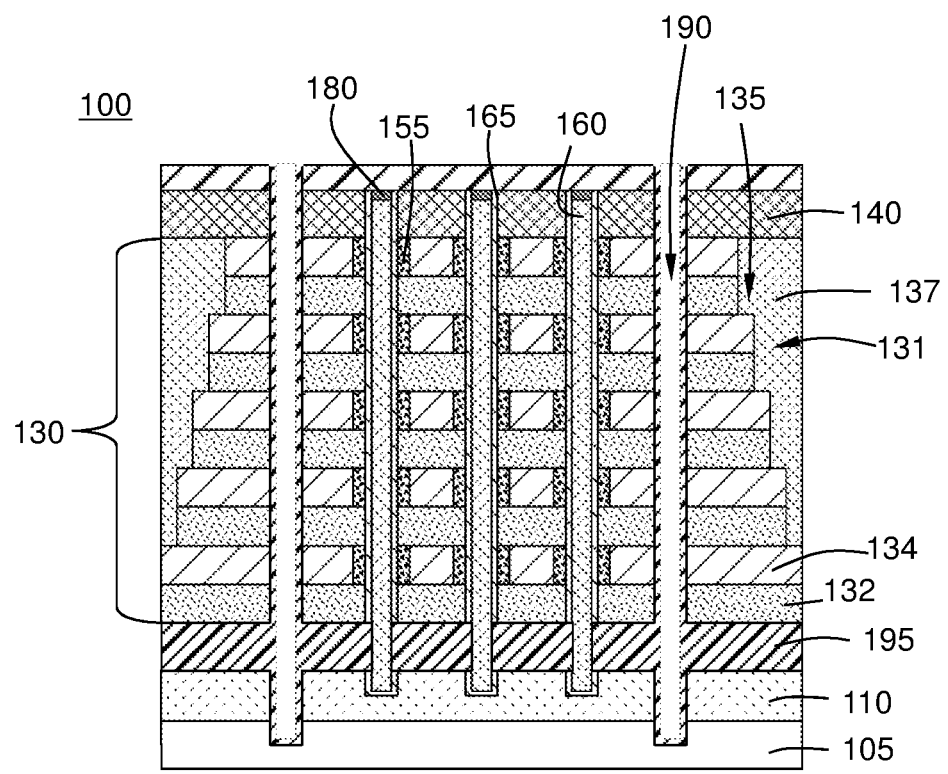
FIG. 11 illustrates a cross-sectional view of a substrate according to one or more embodiments.

FIG. 11 shows operation 60 of method 10 where a semiconductor material (e.g. nitride and poly-silicon fill) 195 is deposited in slit pattern opening 190. The semiconductor material may be any suitable material known to one of skill in the art.

Figure 12:
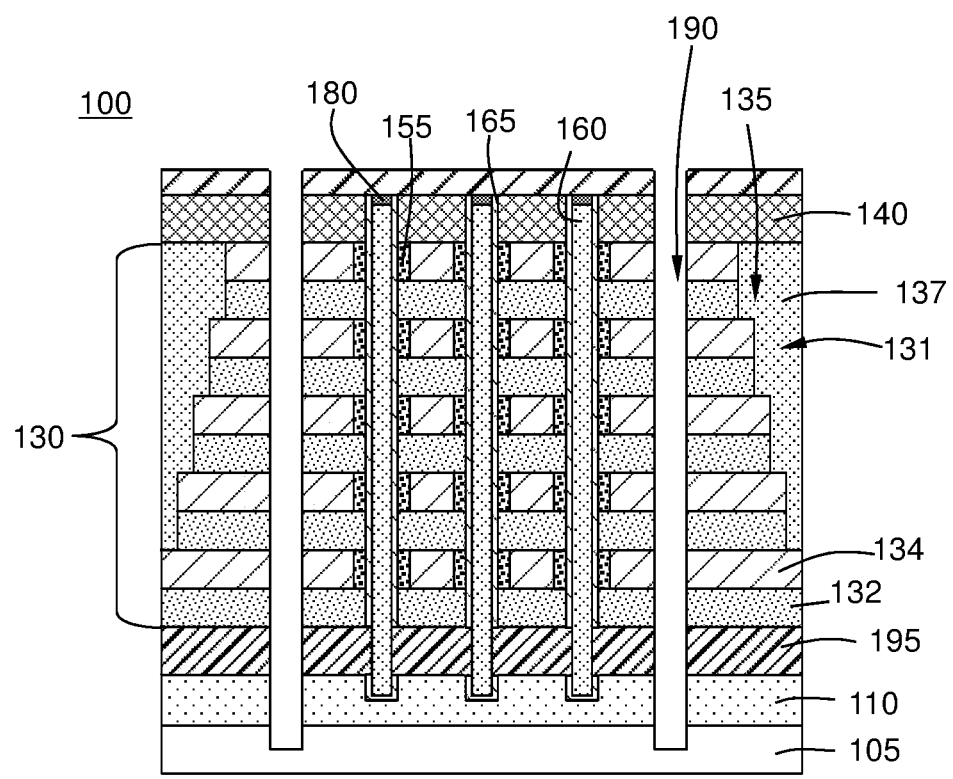
FIG. 12 illustrates a cross-sectional view of a substrate according to one or more embodiments.

FIG. 12 shows where the semiconductor material 195 is removed from the sidewalls of the slit pattern openings 190. Without intending to be bound by theory, the slit pattern openings 190 should be larger than common source line 110 (semiconductor layer 110) height so that there may be an opening in the slit pattern opening 190 in order to remove the semiconductor material 195 from the sidewalls. In one or more embodiments, the semiconductor material 195 is removed from the sidewalls of the slit pattern opening 190 by an isotropic etch process (e.g. wet etching using TMAH or the like).

Figure 13A:
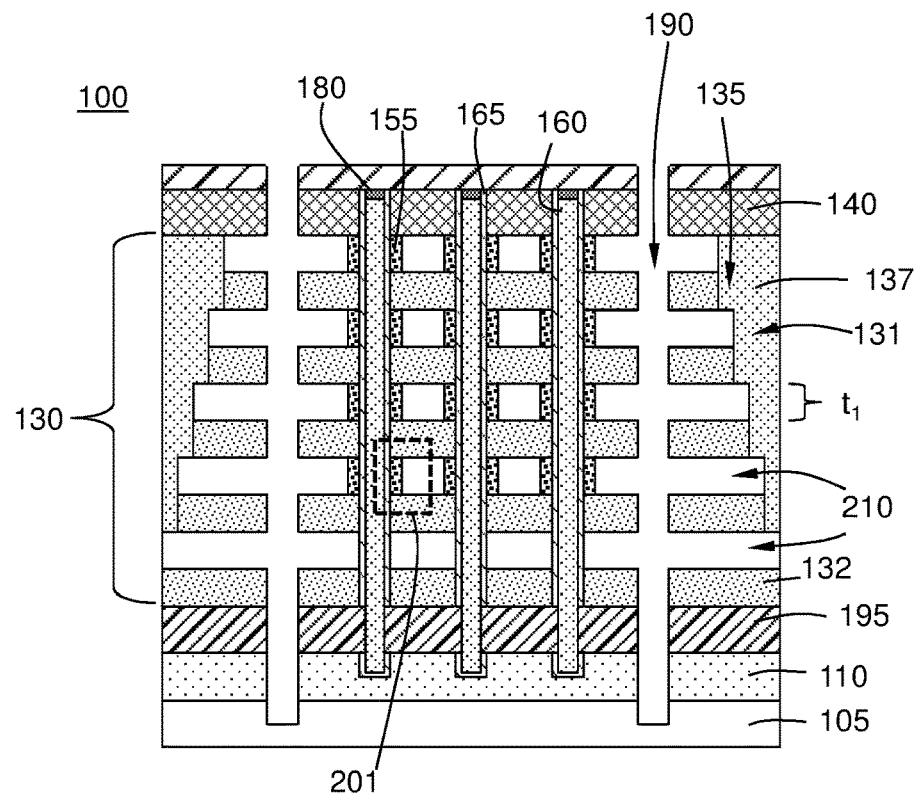
FIG. 13A illustrates a cross-sectional view of a substrate after etching the nitride according to one or more embodiments.
Figure 13B:
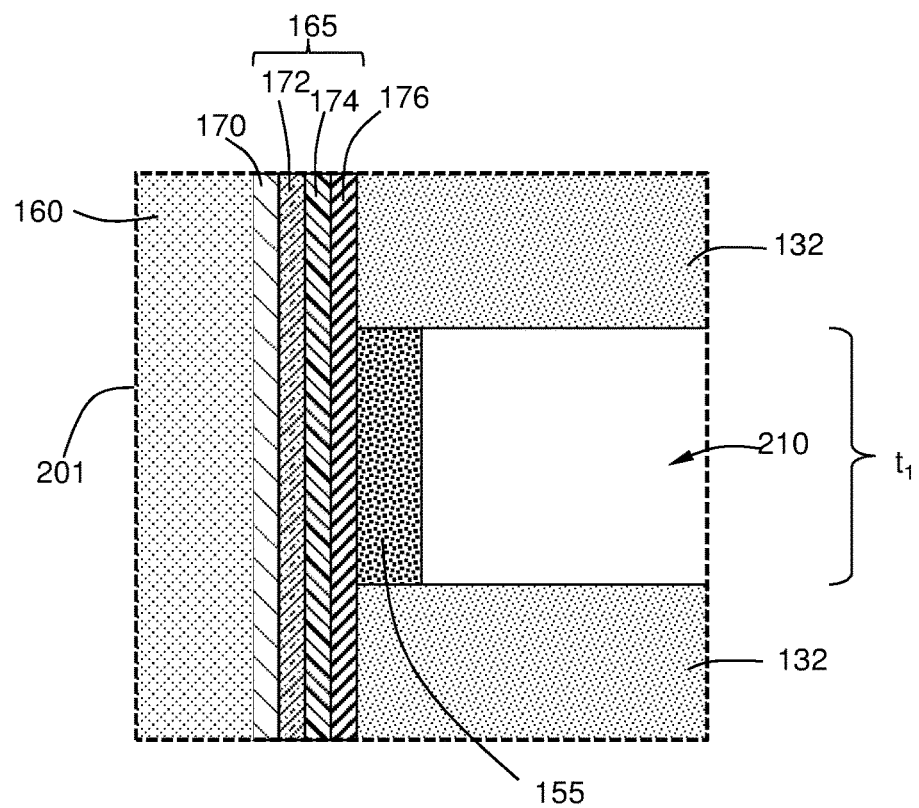
FIG. 13B illustrates an expanded view of region 201 of FIG. 13A.

FIGS. 13A and 13B show operation 65 of method 10 where one or more of the first layers 134, e.g. nitride layers, are removed to form openings 210 and slit pattern opening 190. In one or more embodiments, the openings 210 have a first thickness, $t_1$, in a range of from about 1 nm to about 50 nm, including about 5 nm, about 7 nm, about 10 nm, about 12 nm, about 15 nm, about 17 nm, about 20 nm, about 22 nm, about 25 nm, about 27 nm, about 30 nm, about 32 nm, about 35 nm, about 37 nm, about 40 nm, about 42 nm, about 45 nm, about 47 nm, and about 50 nm. FIG. 13B is an expanded view of a portion 201 of the substrate in FIG. 13A. In one or more embodiments, in removing one or more of the first layers 134, e.g. nitride layers, the first side of the first layers 134, e.g. nitride layers, are exposed to the slit pattern opening 190, and the first side of the first layers 134, e.g. nitride layers, are exposed to an etchant through the slit pattern opening 190.

Figure 14A:
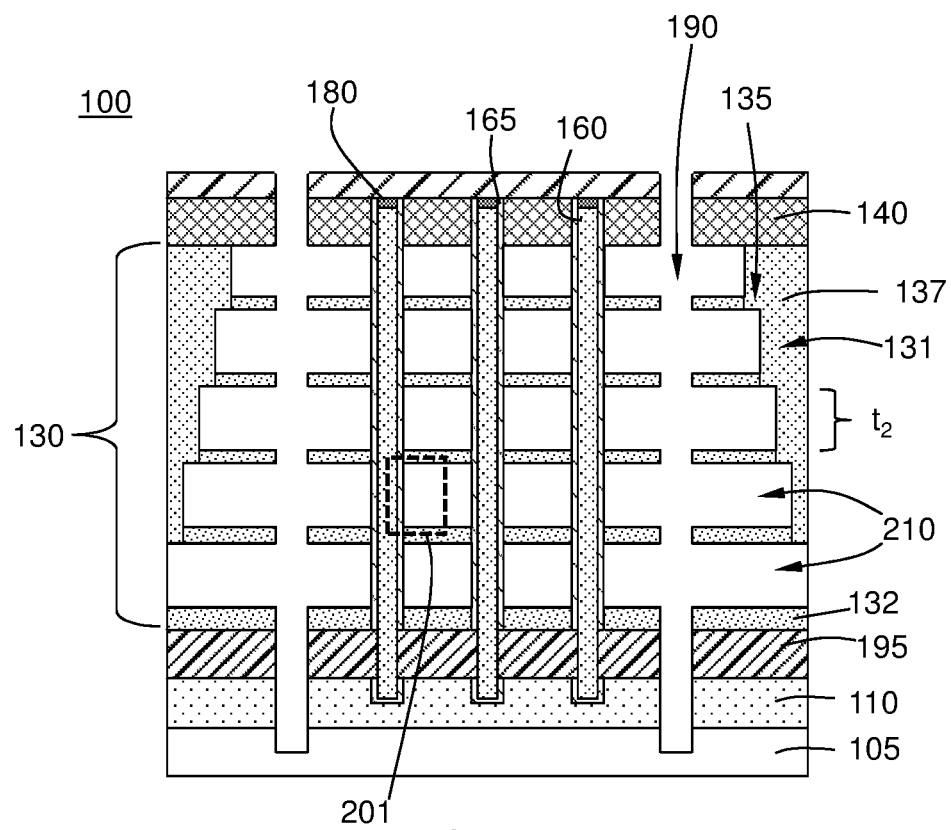
FIG. 14A illustrates a cross-sectional view of a substrate according to one or more embodiments.
Figure 14B:
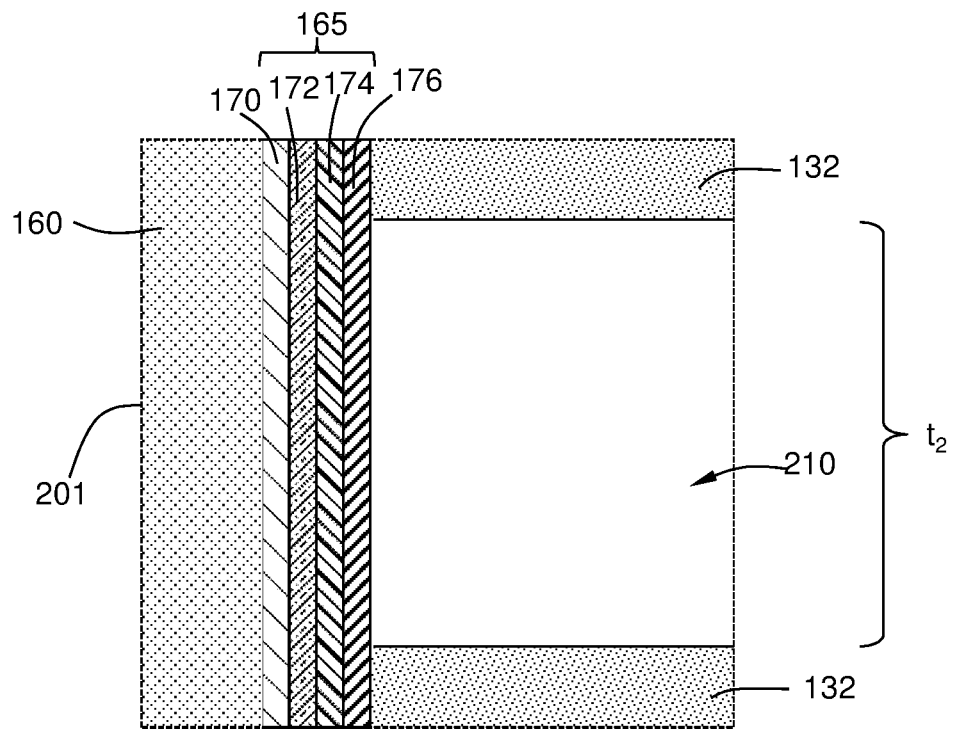
FIG. 14B illustrates an expanded view of region 201 of FIG. 14A.

FIGS. 14A and 14B show operation 70 of method 10 where the second layers 132, e.g. oxide layers, are trimmed through the opening 210 to increase the thickness of the opening 210 from the first thickness, $t_1$, to a second thickness, $t_2$. In one or more embodiments, the second thickness, $t_2$, is greater than or equal to the about 50% to about 75% larger than the first thickness, $t_1$. In one or more embodiments, the second thickness, $t_2$, is about 50%, or about 55%, or about 60%, or about 65%, or about 70%, or about 75% larger than the first thickness, $t_1$. In one or more embodiments, when the second layers 132, e.g. oxide layers, are trimmed, the thickness of the second layers 132 is decreased to a second thickness of the second layer, the second thickness of the second layer smaller than the first thickness of the second layer. In one or more embodiments, the second layers 132, e.g. oxide layers, of the memory stack 130 have an average thickness, second thickness of the second layers 132, in the range of from about 5 nm to about 30 nm, including about 5 nm, about 7 nm, about 10 nm, about 12 nm, about 15 nm, about 17 nm, about 20 nm, about 22 nm, about 25 nm, about 27 nm, and about 30 nm. In one or more embodiments, the oxide layers 132 of the memory stack 130 have an average thickness, second oxide layer thickness, in the range of from about 5 nm to about 30 nm, including about 5 nm, about 7 nm, about 10 nm, about 12 nm, about 15 nm, about 17 nm, about 20 nm, about 22 nm, about 25 nm, about 27 nm, and about 30 nm.

In one or more embodiments, the second layers 132, e.g. oxide layers, are trimmed by exposing the second layers 132, e.g. oxide layers, to a fluorine-based gas phase dry cleaning process or a dilute hydrogen fluoride (HF) solution through the slit pattern opening 190. In one or more embodiments, trimming the second layers 132 comprises exposing the second layers 132 to fluorine-based gas phase dry cleaning chemistry or dilute hydrogen fluoride (HF) chemistry through the slit pattern opening 190. Without intending to be bound by theory it is thought that because dry chemical etching does not involve any liquid, oxide collapse due to surface tension during oxide removal can be avoided. When the second layers 132, e.g. oxide layers, are trimmed, the thickness of the second layers 132, e.g. oxide layers, is decreased, and the thickness of the openings 210 is increased/widened. In one or more embodiments, the thickness of the openings 210 is increased from a first thickness, $t_1$, to a second thickness, $t_2$, and the thickness of the second layers 132, e.g. oxide layers, is decreased to a second thickness of the second layers 132 smaller than the first thickness of the second layers 132.

Figure 15A:
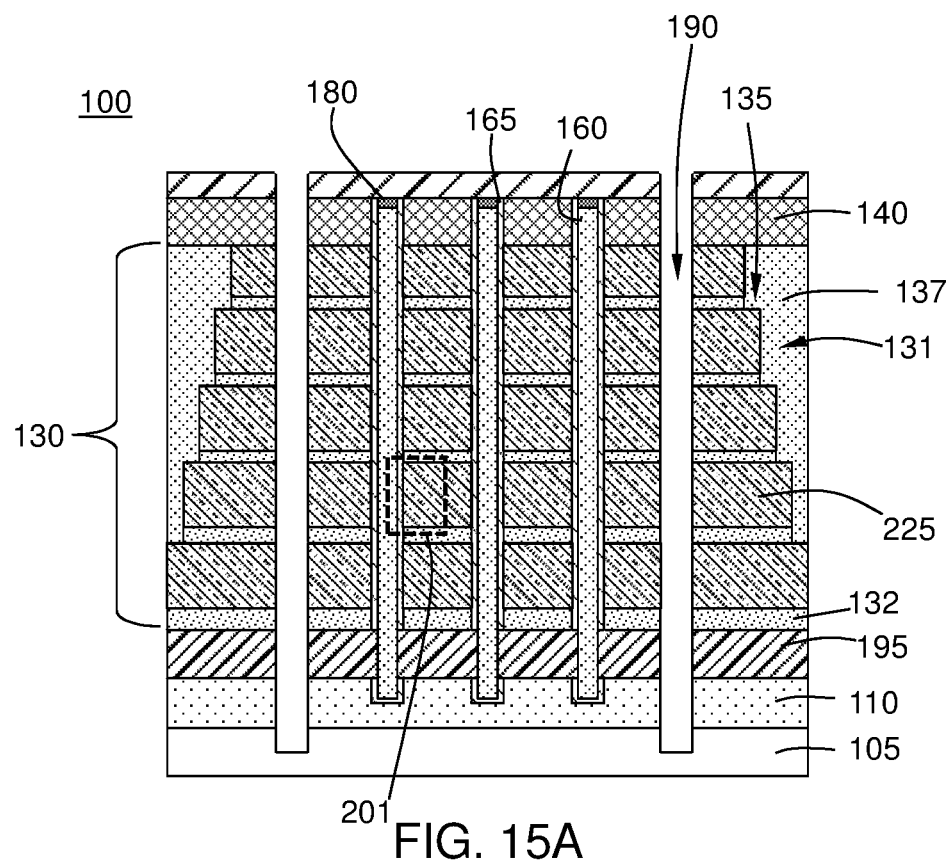
FIG. 15A illustrates a cross-sectional view of a substrate according to one or more embodiments.
Figure 15B:
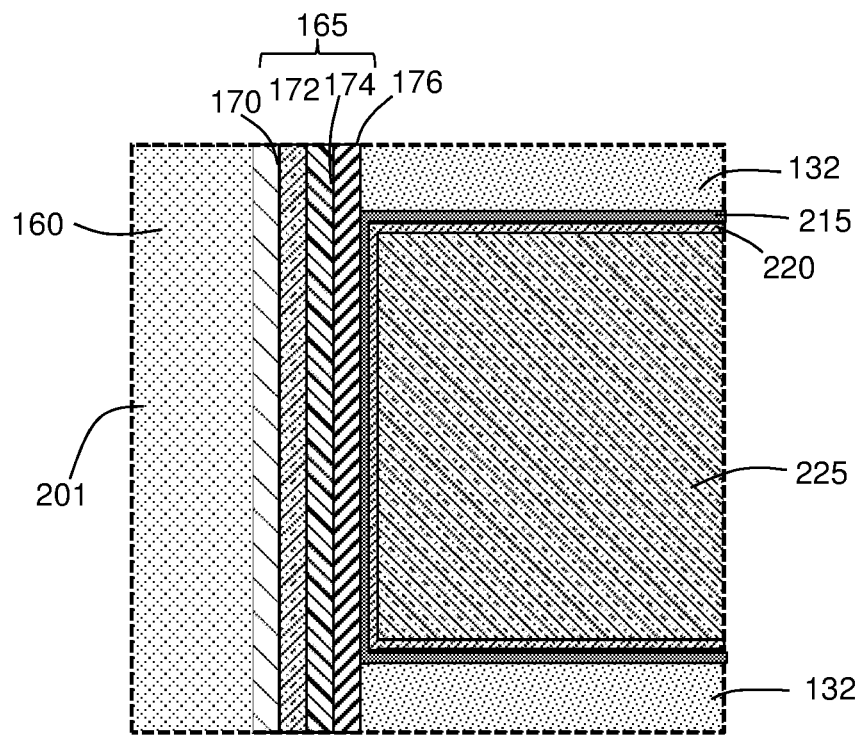
FIG. 15B illustrates an expanded view of region 201 of FIG. 15A.

FIGS. 15A and 15B show operation 75 of method 10 where an aluminum oxide layer 215 and a word line replacement material 225 are deposited in the opening 210. FIG. 15B is an expanded view of a portion 201 of the device of FIG. 15A. In one or more embodiments, the word line replacement material 225 comprises a nitride liner 220 (e.g. titanium nitride, tantalum nitride, or the like) and a bulk metal comprising one or more of copper (Cu), cobalt (Co), tungsten (W), aluminum (Al), ruthenium (Ru), iridium (Ir), molybdenum (Mo), platinum (Pt), tantalum (Ta), titanium (Ti), or rhodium (Rh). In one or more embodiments, the bulk metal comprises tungsten (W). In other embodiments, the bulk metal layer comprises ruthenium (Ru).

Figure 16:
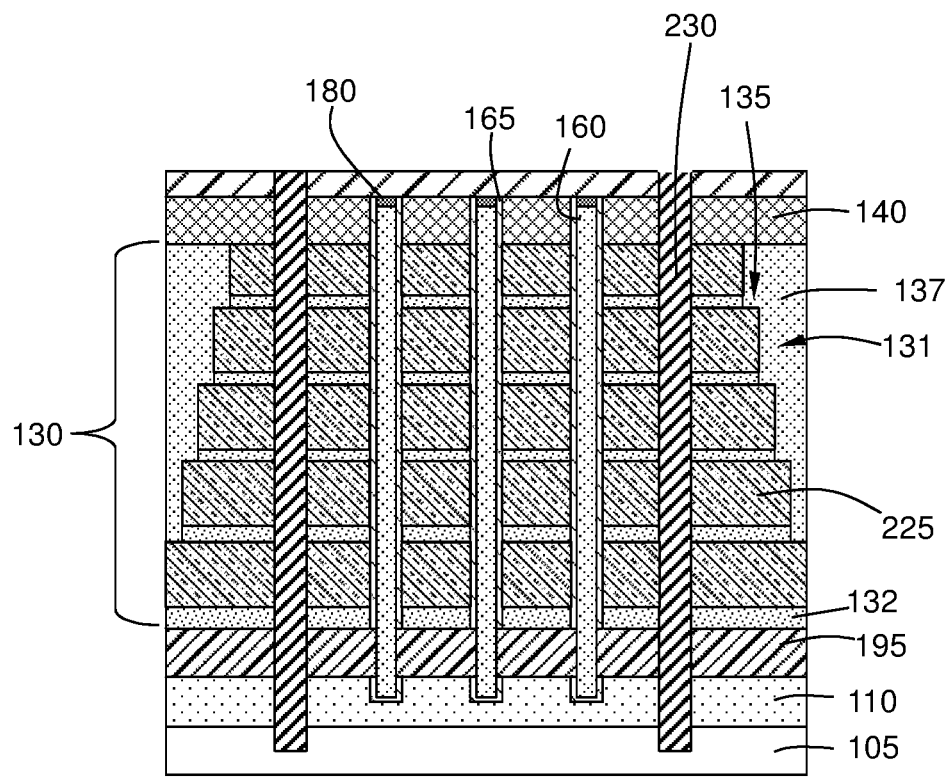
FIG. 16 illustrates a cross-sectional view of a substrate according to one or more embodiments.

FIG. 16 shows operation 80 of method 10 where the slit pattern opening 190 is filled with a fill material 230. The fill material 230 may be any suitable material known to one of skill in the art. In one or more embodiments, the fill material 230 comprises one or more of a dielectric material or a conductor material. As used herein, the term "dielectric material" refers to a layer of material that is an electrical insulator that can be polarized in an electric field. In one or more embodiments, the dielectric material comprises one or more of oxides, carbon doped oxides, silicon oxide (SiO), porous silicon dioxide ($SiO_2$), silicon oxide (SiO), silicon nitride (SiN), silicon oxide/silicon nitride, carbides, oxycarbides, nitrides, oxynitrides, oxycarbonitrides, polymers, phosphosilicate glass, fluorosilicate (SiOF) glass, or organosilicate glass (SiOCH).

Figure 17:
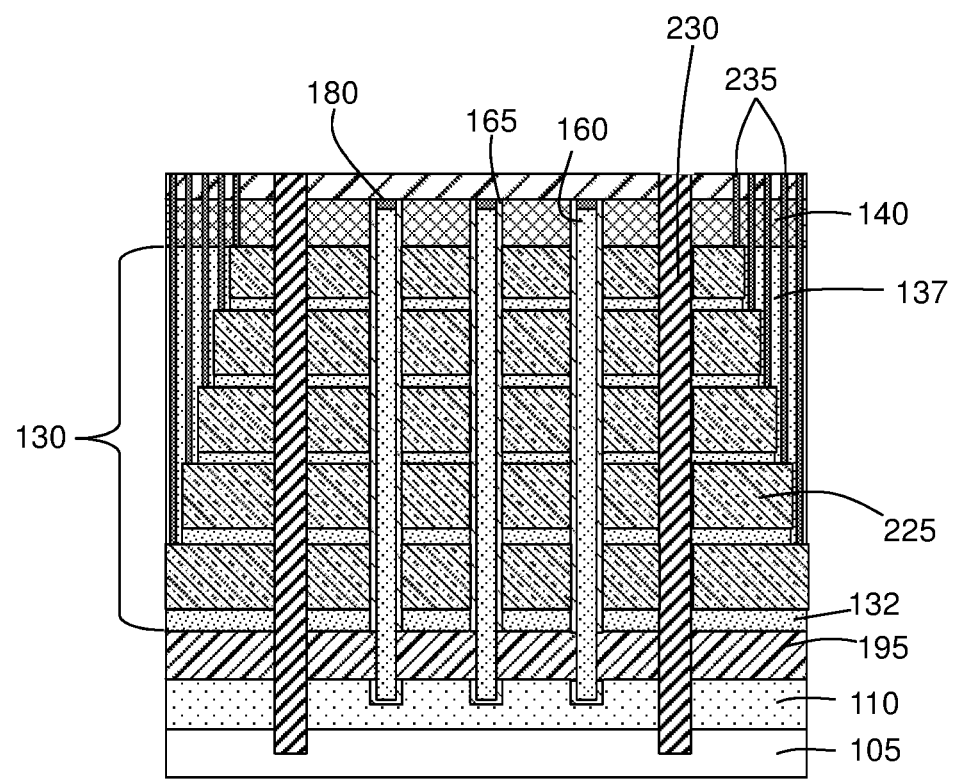
FIG. 17 illustrates a cross-sectional view of a substrate according to one or more embodiments.

FIG. 17 shows operation 85 of method 10 where word line contacts 235 are formed. The word line contacts 235 extend through the memory stack 130 a distance sufficient to terminate at one of the word lines 225. In one or more embodiments, the word line contacts 235 can comprise any suitable material known to the skilled artisan. In one or more embodiments, the word line contact 235 comprises one or more of a metal, a metal silicide, poly-silicon, amorphous silicon, or EPI silicon. In one or more embodiments, the word line contact is doped by either N type dopants or P type dopants in order to reduce contact resistance. In one or more embodiments, the metal of the word line contact 235 is selected from one or more of copper (Cu), cobalt (Co), tungsten (W), titanium (Ti), molybdenum (Mo), nickel (Ni), ruthenium (Ru), silver (Ag), gold (Au), iridium (Ir), tantalum (Ta), or platinum (Pt).

Figure 18:
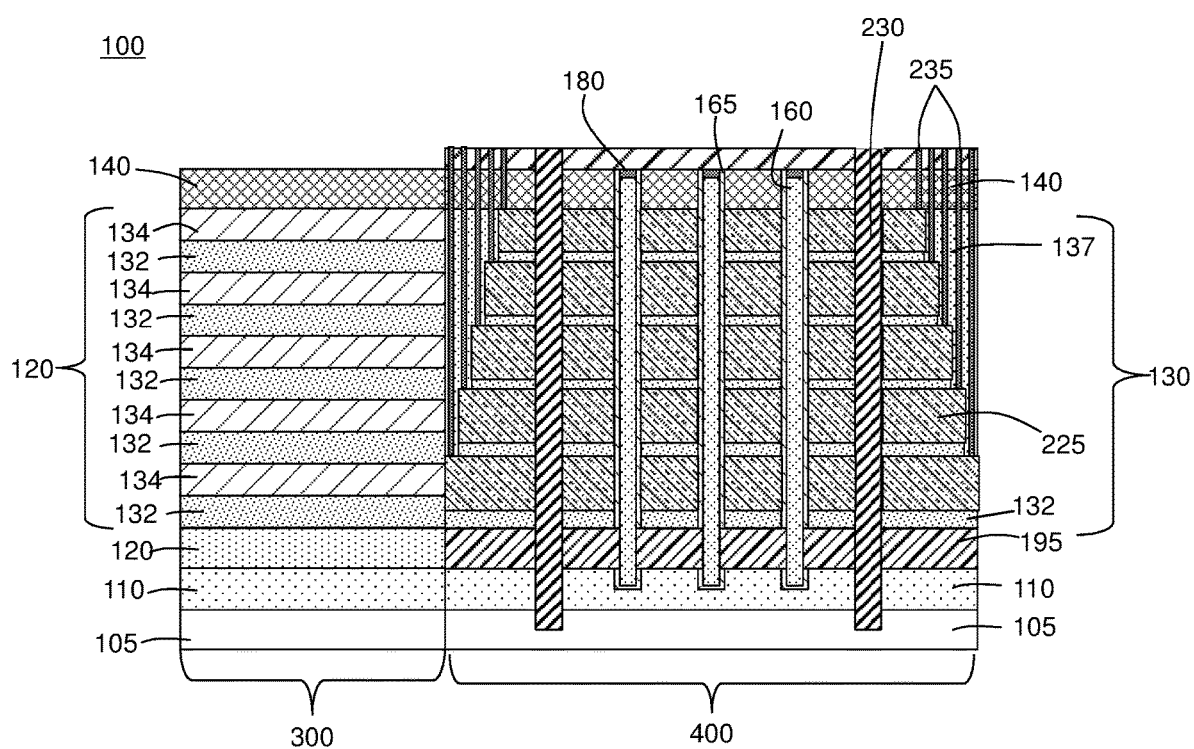
FIG. 18 illustrates a cross-sectional view of a substrate according to one or more embodiments.

FIG. 18 shows a semiconductor memory device according to one or more embodiments. The memory device 100 comprises: a film stack 120 comprising alternating first layers 134, e.g. nitride layers, and second layers 132, e.g. oxide layers, in a first portion 300 of the device 100, the alternating first layers 134, e.g. nitride layers, and second layers 132, e.g. oxide layers, of the film stack 120 having a nitride:oxide thickness ratio ($N_f:O_f$). A memory stack 130 comprising alternating word line 225 and second layers 132, e.g. oxide layers, in a second portion 400 of the device 100, the alternating word line 225 and second layers 132, e.g. oxide layers, of the memory stack 130 having a word line:oxide thickness ratio ($W_m:O_m$), wherein $0.1(W_m:O_m) < N_f:O_f < 0.95(W_m:O_m)$. In one or more embodiments, $0.2(W_m:O_m) < N_f:O_f < 0.9(W_m:O_m)$. In other embodiments, $0.5(W_m:O_m) < N_f:O_f < 0.75(W_m:O_m)$. In one or more embodiments, the first layers 134, e.g. nitride layers, of the film stack 120 have a thickness in a range of from about 0.5 nm to about 30 nm, including about 1 nm, about 3 nm, about 5 nm, about 7 nm, about 10 nm, about 12 nm, about 15 nm, about 17 nm, about 20 nm, about 22 nm, about 25 nm, about 27 nm, and about 30 nm. In one or more embodiments, $W_m:O_m$ is in the range of from about 2.5:2 to about 3.5:2.

In one or more embodiments the first layers 134, e.g. nitride layers, of the film stack 120 has a thickness in the range of from about 0.5 to about 50 nm, including a range of from about 1 nm to about 50 nm, and a range of from 1 nm to about 30 nm. In one or more embodiments, the second layers 132, e.g. oxide layers, of the memory stack 130 have an average thickness in the range of from about 10 nm to about 20 nm.

In one or more embodiments, a method of forming an electronic device comprises removing one or more first layers from a film stack comprising alternating second layers and first layers, the first layers removed from a first side of the first layers to leave an opening bounded on a second side by one or more films comprising a poly-silicon layer, the opening having a first thickness; trimming the adjacent second layers through the opening to increase the thickness of the opening from the first thickness to a second thickness and decrease a first second layer thickness to a second oxide layer thickness smaller than the first second layer thickness; and depositing a word line replacement material in the opening.

Figure 19:
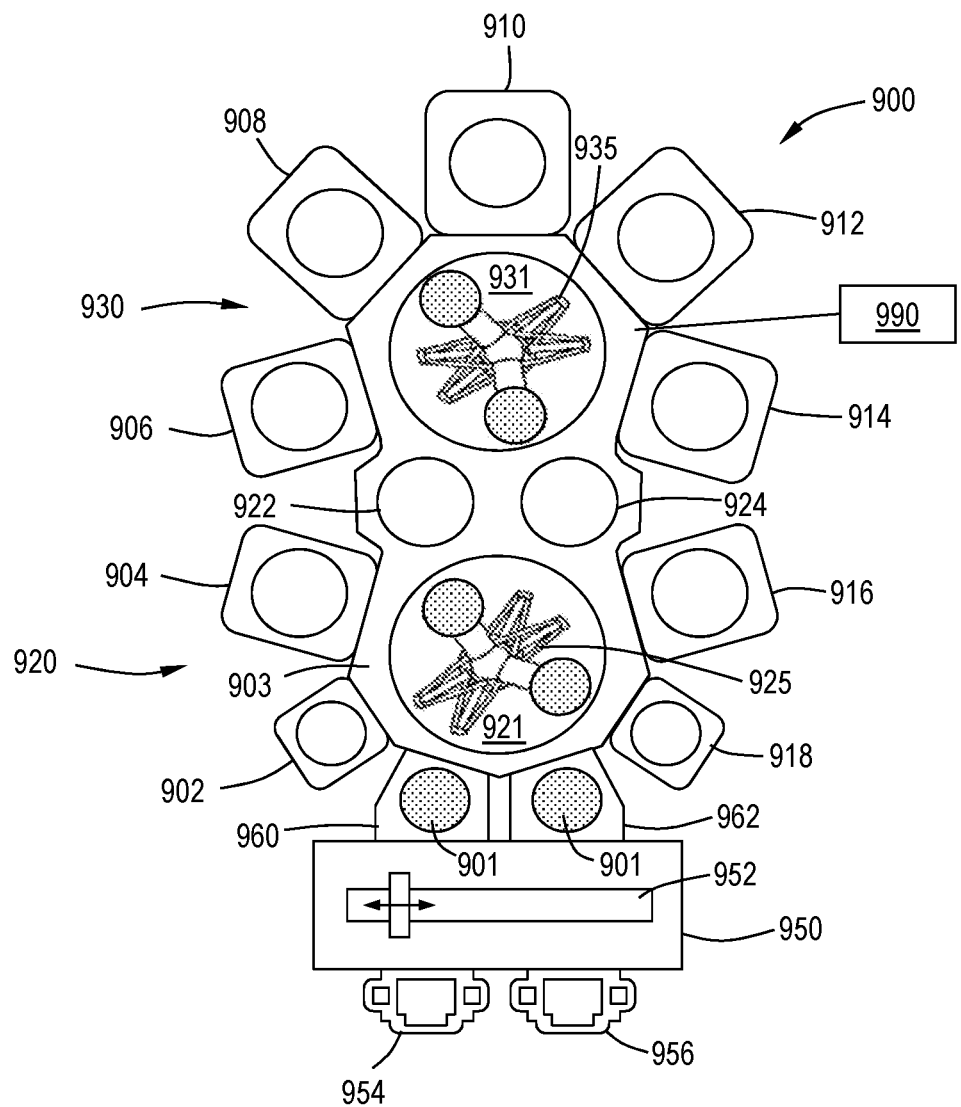
FIG. 19 illustrates a cluster tool according to one or more embodiments.

Additional embodiments of the disclosure are directed to processing tools 900 for the formation of the memory devices and methods described, as shown in FIG. 19.

The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a preclean chamber, a buffer chamber, transfer space(s), a wafer orienter/degas chamber, a cryo cooling chamber, a deposition chamber, annealing chamber, etching chamber, a selective oxidation chamber, an oxide layer thinning chamber, or a word line deposition chamber. The particular arrangement of process chambers and components can be varied depending on the cluster tool and should not be taken as limiting the scope of the disclosure.

In some embodiments, the cluster tool 900 includes an oxide layer thinning chamber. The oxide layer thinning chamber of some embodiments comprises one or more a fluorine-based dry cleaning chamber. In some embodiments, the cluster tool 900 includes a pre-cleaning chamber connected to the central transfer station.

In the embodiment shown in FIG. 19, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In some embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930, or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit, memory, suitable circuits and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the system controller 990 has a configuration to control the selective oxidation chamber to selectively oxidize the first layers, e.g. nitride layers, on a wafer at a temperature in the range of from about 400° C. to about 900° C. in an atmosphere of hydrogen ($H_2$) gas and oxygen ($O_2$) gas at ambient pressure. In some embodiments, the controller 990 has a configuration to activate the oxide layer thinning chamber to remove portions of an oxide layer from the wafer using fluorine-based dry etching of hydrogen fluoride (HF) solution based etching.

In one or more embodiments, a processing tool comprises: a central transfer station comprising a robot configured to move a wafer; a plurality of process stations, each process station connected to the central transfer station and providing a processing region separated from processing regions of adjacent process stations, the plurality of process stations comprising an oxide layer thinning chamber and a word line deposition chamber; and a controller connected to the central transfer station and the plurality of process stations, the controller configured to activate the robot to move the wafer between process stations, and to control a process occurring in each of the process stations.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming an electronic device, the method comprising:
   removing one or more first layers from a film stack comprising alternating second layers and first layers, the first layers removed from a first side of the first layers to leave an opening bounded on a second side by one or more films comprising a poly-silicon layer, the opening having a first thickness;
   trimming the second layers through the opening to increase the thickness of the opening from the first thickness to a second thickness and decrease a first thickness of the second layer to a second thickness of the second layer smaller than the first thickness of the second layer; and
   depositing a word line replacement material in the opening.

2. The method of claim 1, wherein the first layers comprise nitride layers and the second layers comprises oxide layers.

3. The method of claim 2, wherein the second layers comprise silicon oxide, and the first layers comprise silicon nitride.

4. The method of claim 1, wherein the second thickness is greater than or equal to about 50% larger than the first thickness.

5. The method of claim 1, wherein the first thickness is in a range of from about 1 nm to about 50 nm.

6. The method of claim 1, wherein removing the one or more first layers further comprises:
   forming a slit pattern opening through the film stack, the first side of the first layers exposed be the slit pattern opening; and
   exposing the first side of the first layers to an etchant through the slit pattern opening.

7. The method of claim 6, wherein trimming the second layers comprises exposing the second layers to fluorine-based gas phase dry cleaning chemistry or dilute HF chemistry through the slit pattern opening.

8. The method of claim 1, wherein the word line replacement material comprises tungsten.

9. The method of claim 8, wherein the word line replacement material further comprises a titanium nitride liner between the tungsten and the second layers.

10. The method of claim 1, further comprising:
    forming a memory hole channel through the film stack;
    depositing a first oxide channel layer;
    depositing a nitride channel layer on the first oxide channel layer;
    depositing a second oxide channel layer on the nitride channel layer; and
    forming the poly-silicon layer in the memory hole channel on the second oxide channel layer.

11. The method of claim 1, further comprising exposing the opening to an in situ steam process to form an in situ steam generated (ISSG) oxide layer or radical plasma oxidation (RPO) oxide layer at the second side of the opening.

12. The method of claim 11, wherein the in situ steam generated (ISSG) oxide layer is formed at a temperature in a range of from about 700° C. to about 900° C. in an atmosphere of hydrogen ($H_2$) gas and oxygen ($O_2$) gas at ambient pressure.

13. The method of claim 12, wherein the oxidized layer at the second side of the opening is removed from the second side of the opening at the same time as trimming the second layers.

14. The method of claim 12, wherein the ISSG oxide layer or RPO oxide layer has a thickness of about 2 nm.

15. A semiconductor memory device comprising:
    a film stack comprising alternating nitride and oxide layers in a first portion of the semiconductor memory device, the alternating nitride and oxide layers of the film stack having a nitride:oxide thickness ratio ($N_f:O_f$); and
    a memory stack comprising alternating word line and oxide layers in a second portion of the semiconductor memory device, the alternating word line and oxide layers of the memory stack having a word line:oxide thickness ratio ($W_m:O_m$),
    wherein $0.1(W_m:O_m) < N_f:O_f < 0.95(W_m:O_m)$.

16. The semiconductor memory device of claim 15, wherein the nitride layers of the film stack have a thickness in a range of from about 1 nm to about 50 nm.

17. The semiconductor memory device of claim 15, wherein the oxide layers of the memory stack have an average thickness in a range of from about 10 nm to about 20 nm.

18. The semiconductor memory device of claim 15, wherein $W_m:O_m$ is in a range of from about 2.5:2 to about 3.5:2.

19. A processing tool comprising:
    a central transfer station comprising a robot configured to move a wafer;
    a plurality of process stations, each process station connected to the central transfer station and providing a processing region separated from processing regions of adjacent process stations, the plurality of process stations comprising an oxide layer thinning chamber and a word line deposition chamber; and
    a controller connected to the central transfer station and the plurality of process stations, the controller configured to activate the robot to move the wafer between process stations, and to control a process occurring in each of the process stations.

20. The processing tool of claim 19, wherein the oxide layer thinning chamber is a fluorine-based dry cleaning chamber.

* * * * *